(12) United States Patent
Okada et al.

(10) Patent No.: US 6,937,019 B2
(45) Date of Patent: *Aug. 30, 2005

(54) SUPERSENSITIVE NUCLEAR MAGNETIC RESONANCE MICRO IMAGING APPARATUS

(76) Inventors: Michiya Okada, c/o Hitachi, Ltd., Intellectual Property Group, New Marunouchi Bldg., 5-1, Marunouchi 1-chome, Chiyoda-ku, Tokyo 100-8220 (JP); Tsuyoshi Wakuda, c/o Hitachi, Ltd., Intellectual Property Group, New Marunouchi Bldg., 5-1, Marunouchi 1-chome, Chiyoda-ku, Tokyo 100-8220 (JP); Shigeru Kakugawa, c/o Hitachi, Ltd., Intellectual Property Group, New Marunouchi Bldg., 5-1, Marunouchi 1-chome, Chiyoda-ku, Tokyo 100-8220 (JP); Hiroshi Morita, c/o Hitachi, Ltd., Intellectual Property Group, New Marunouchi Bldg., 5-1, Marunouchi 1-chome, Chiyoda-ku, Tokyo 100-8220 (JP); Katsuzou Aihara, c/o Hitachi, Ltd., Intellectual Property Group, New Marunouchi Bldg., 5-1, Marunouchi 1-chome, Chiyoda-ku, Tokyo 100-8220 (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/656,185
(22) Filed: Sep. 8, 2003

(65) Prior Publication Data
US 2004/0046556 A1 Mar. 11, 2004

Related U.S. Application Data

(63) Continuation of application No. 10/326,085, filed on Dec. 23, 2002.

(30) Foreign Application Priority Data
May 8, 2002 (JP) .................................... 2002-132253

(51) Int. Cl.$^7$ .................................................. G01V 3/00
(52) U.S. Cl. ...................................................... 324/321
(58) Field of Search ................................. 324/300, 307, 324/309, 318, 321, 310; 600/410; 335/296, 300, 306

(56) References Cited

U.S. PATENT DOCUMENTS

3,764,892 A 10/1973 Rollwitz
5,552,709 A * 9/1996 Anderson .................... 324/321

(Continued)

FOREIGN PATENT DOCUMENTS

JP 07-240310 9/1995
JP 7-240310 9/1995

OTHER PUBLICATIONS

Lee et al., "One Micrometer Resolution NMR Microscopy", *Journal of Magnetic Resonance*, vol. 150, No. 2, Jun. 2001, pp. 207–213.

(Continued)

Primary Examiner—Christopher W. Fulton
Assistant Examiner—Dixomara Vargas
(74) Attorney, Agent, or Firm—Antonelli, Terry, Stout & Kraus, LLP

(57) ABSTRACT

A supersensitive nuclear magnetic resonance imaging apparatus includes superconducting magnet, a gradient magnetic field coil, a high frequency emitting coil, and a receiving coil, wherein a biosample, including at least one of cells, organic tissues, and laboratory small animals, is inserted in a sample chamber of generally 1 to 30 mm in diameter. The superconducting magnet is formed of laterally divided split magnets, and the direction of the magnetic field generated by the magnet is generally horizontal. The receiving coil is in the form of a solenoid coil, and the biosample is inserted from a direction orthogonal to the direction of the magnetic field in a generally vertical direction. The spatial resolution in imaging of the biosample is not more than one-tenth of a cell that forms the biosample.

17 Claims, 13 Drawing Sheets

U.S. PATENT DOCUMENTS

| | | | | |
|---|---|---|---|---|
| 6,163,154 A | * | 12/2000 | Anderson et al. | 324/320 |
| 6,169,402 B1 | * | 1/2001 | Oka et al. | 324/318 |
| 6,198,281 B1 | * | 3/2001 | Wand et al. | 324/300 |
| 6,201,392 B1 | * | 3/2001 | Anderson et al. | 324/300 |
| 2003/0076103 A1 | * | 4/2003 | Okada et al. | 324/321 |

OTHER PUBLICATIONS

Minard et al., "Picoliter $^1$H NMR Spectroscopy", *Journal of Magnetic Resonance*, vol. 154, No. 2, Feb. 2002, pp. 336–343.

Wind et al., "An Integrated Confocal and Magnetic Resonance Microscope for Cellular Research", *Journal of Magnetic Resonance*, vol. 147, No. 2, Dec. 2000, pp. 371–377.

* cited by examiner

DIRECTION OF MAGNETIC FIELD

DIRECTION OF MAGNETIC FIELD

SUPERSENSITIVE NUCLEAR MAGNETIC RESONANCE MICRO IMAGING APPARATUS

CROSS-REFERENCE TO RELATED APPLICATION

This is a continuation of U.S. application Ser. No. 10/326,085, filed Dec. 23, 2002, the subject matter of which is incorporated by reference herein.

BACKGROUND OF THE INVENTION

The present invention relates to a supersensitive nuclear magnetic resonance imaging apparatus; and, more particularly, the invention relates to an apparatus for effecting a high resolution imaging of biosamples, such as cells, organic tissues, laboratory small animals, or the like, and to growth of a high-grade protein crystal using high resolution imaging, on-site observation of the process of growth, and a method of growth.

In recent years, rapid advances have been made in an imaging method utilizing nuclear magnetic resonance (NMR) imaging. If an analysis of the metabolism of cells or a protein information network in living organisms, such as human bodies, small animals, or cellular structures, can be made possible in the future by combining the NMR method and a powerful superconducting magnet technology, it will be possible for the structure or function of the protein in cells to be revealed. Thus, there are great hopes that this technology may play a great roll in the study of life science, such as the prevention of disease or the development of new drugs. In recent years, effective analysis of the structure of an organic compound, such as a protein, which has a complicated molecular structure, at the bioatomic level, became possible by the use of nuclear magnetic resonance spectroscopy.

The object of the present invention is to provide a supersensitive nuclear magnetic resonance imaging apparatus having spatial resolutions not more than 1 micron, and, more preferably, in the order of 0.1 micron, which is required for enabling an analysis of the metabolism of cells or the protein information network in cells in living organisms, such as small animals or cellular structures, that corresponds to a special imaging apparatus requiring a high performance that is three digits higher in spatial resolution, at least one digit higher in field strength of a superconducting magnet, four digits higher in uniformity of the magnetic fields, and three digits higher in stability in comparison with a medical MRI image diagnostic apparatus of the type used for laminagraphy of human bodies, which requires an image resolution in the so-called millimeter category, thus requiring completely different design technology and apparatus manufacturing technology.

Heretofore, a nuclear magnetic resonance imaging apparatus has been used as a medical image diagnostic apparatus having a field strength in the range of 0.2 to 8 T for application to a partial or entire human body, and, generally, magnetic fields in the order of 0.3 to 1.5 Tesla are used in many cases. A detailed description of the latest technology relating to such a nuclear magnetic resonance imaging apparatus is described in "MR imaging technology" by the Japanese Society of Radiological Technology, published by Ohmsha, 2001. In imaging utilizing a superconducting magnet, magnetic fields of not less than 0.5 Tesla are utilized, and the spatial resolution of images in the medical nuclear magnetic resonance image diagnostic apparatus is generally 0.2 mm.

A spectroscopic apparatus using high magnetic fields in the order of 14 to 21 T for the purpose of utilizing a nuclear magnetic resonance analyzing method for analyzing the structure of organic matter or protein also has been developed. The latest developments relating to a typical apparatus structure to be used in the case of employing such a high-magnetic-field NMR in nuclear magnetic resonance imaging includes the technology relating to a superconducting magnet disclosed in JP-A-2000-147082, which describes a typical structure of a multi-layer hollow solenoid coil; the technology relating to signal detection as described in U.S. Pat. No. 6,121,776, which describes a birdcage superconducting detector coil; and the technology disclosed in JP-A-2000-266830 and in JP-A-6-237912 which describe signal detecting using saddle type coils or birdcage coils. According to the descriptions provided in these publications, a high resolution nuclear magnetic resonance analyzing apparatus employs a superconducting magnetic apparatus constructed of a combination of solenoid coils that generate magnetic fields in the vertical direction for irradiating an electromagnetic wave of 400 to 900 MHz to a sample and detecting a resonant wave generated by the sample by the use of a saddle type or a birdcage type of detector coils. There is also a case in which, as shown in the example disclosed in U.S. Pat. No. 6,121,776, a detector that is cooled to low temperatures for reducing heat noise generated when receiving the resonant wave is used for improving the S/N sensitivity ratio.

Historically, the nuclear magnetic resonance spectroscopic apparatus has been improved in its sensitivity basically by maintaining the same basic system structure, such as the antenna, magnet, and the like, while increasing the central magnetic field strength of the superconducting magnet. Therefore, though the highest NMR measurement sensitivity reported thus far is obtained by an NMR apparatus of 900 MHz using a large superconducting magnet having a central magnetic field of 21.1 Tesla, the basic structure of the apparatus is no different from that described in JP-A-2000-147082. With a protein in solution being generally used as a sample, improvement of the central magnetic field has effects on improvement of the sensitivity in NMR spectroscopy and on identification of the separation of a chemical shift.

As regards the effect of improvement of the sensitivity due to the configuration of the detector coil, as described on P.326 of "The NMR" written by Yoji ARATA, published by Maruzen, 2000, it has been known that employing a solenoid coil as a detector coil brings about various advantages in comparison with the case where a saddle type or birdcage type coil is used. For example, a solenoid coil is known to be superior in impedance controllability, filling factors, and in the efficiency of the RF magnetic field which it produces. According to this publication, however, when the sensitivity is important, as in the case of measuring a minute amount of protein dissolved in an aqueous solution, it is impossible to wind a solenoid coil around a sample tube placed with a vertical orientation with respect to the magnetic field in the currently available superconducting magnet structure as a matter of fact, and thus such a coil is not generally used. As an exception, there is a case in which it is used in a limited manner for a sensitive measurement using a minute amount of sample solution, and a method of measuring with a specially designed micro sample tube and a specific probe is known.

In a specific example, JP-A-11-248810 discloses a method of magnetizing a high temperature superconducting bulk magnet in the horizontal direction, and the NMR signal is detected by means of a solenoid coil. Alternatively, JP-A-7-240310 discloses a method of constructing a superconducting magnet and a cooling container suitable for use in general NMR imaging for eliminating the limitation of the height of the apparatus due to the height of the ceiling. However, a method of improving the detection sensitivity required for high resolution imaging and a technical application for obtaining a uniformity of the magnetic fields or time-based stability of the magnetic field are not disclosed.

Remarkable progress has been made in recent years in the life sciences, but an understanding of the correlation between the function and the structure of a protein molecule at the biocellular level is not sufficient. Though there exist about $10^{11}$ kinds of protein in the natural world, protein molecules having a structure which is known only number in the order of $10^{3-4}$ kinds, and studies utilizing high resolution NMR imaging, such as metabolism in a living organism, clarification of a protein communication network, or the like, have just started.

In addition, it is quite important for the progress of the life sciences to obtain a high-quality monocrystal of protein, but the growth of a high-quality protein crystal that can be analyzed sufficiently is still difficult, and the growth thereof requires several months to several years. The principal factor responsible for this difficulty consists in the fact that crystallization of a protein is carried out by a cut-and-try method that relies on experience. Though the mechanism of protein crystal growth has been examined since the middle of the 1980's, what is known at the present time is that the basic mechanism of crystal growth can be explained by the same mechanism irrespective of whether it is inorganic or organic, or low molecular or high molecular. High resolution NMR imaging is considered to be usable for clarification of such a mechanism of protein crystal growth or automation or optimization of the control of growth conditions.

Recently, the study of a life mechanism using cells in a living organism, living body tissues, small animals, and the like was made in association with an increase in the need to advance life science studies. If the metabolism of a protein in the living body, or the information network of the same, can be clarified by the use of a nuclear magnetic resonance imaging method, it is considered that worthwhile effects can be obtained in the advancement of the life sciences. However, the spatial resolution of the current nuclear magnetic resonance analyzing apparatus is generally 0.2 mm, and thus a minute area in the order of 1 to 10 micron, which represents the sizes of cells, cannot be imaged.

Accordingly, the present invention provides a method of enabling imaging of images on a scale one digit smaller than the cell size. Applying such a method and enabling it to be used for analyzing the metabolism of cells of living organisms or a bioinfomatic network, or on-site protein crystal growth significantly contributes to the development of the life sciences.

In order to adapt a nuclear magnetic resonance analyzing apparatus to such needs, it is required to improve the measurement sensitivity, while maintaining a sample space which meets the study needs in biology, and ensuring the stability of superconducting magnetic fields is also essential. Improvement of the measurement sensitivity and the uniformity of the magnetic fields in the sample space are important to improve the spatial resolution. Therefore, the nuclear magnet resonance analyzing apparatus that will be used for analyses in the study based on molecular biology in the future should be designated as a "nuclear magnetic resonance imaging" apparatus, which requires exceptional detection sensitivity and stability and the capability of detecting an NMR signal stably in comparison with the conventional NMR apparatus. When the magnetic fields are not uniform, problems, such as difficulty in identification of images, may occur. Therefore, it should be noted that NMR technology in the future, as directed to various analyses in the study of molecular biology, requires a new development of technology that is not the simple continuation of the general NMR apparatus of the type currently available.

For example, the specification of uniformity of the magnetic fields in the general NMR apparatus is 0.01 ppm in a sample space and 0.01 ppm/h in time-based stability. When converting these values by Proton NMR of 600 MHz for general use, the allowable error is 6 Hz. However, the aforementioned nuclear magnetic resonance imaging requires a space and time-based resolution of at least 1.0 Hz or less, and preferably, 0.5 Hz or less. The superconducting magnet or the detector coil must be optimally constructed in such a manner that such a uniformity of the magnetic field and time-based stability can be realized. Therefore, the performance of the NMR apparatus that has been generally used to date is not sufficient, and thus a stability and uniformity of the magnetic field that is one digit higher are required.

In the currently available apparatus, there arose a problem of installability such that a specific building was necessary because the apparatus was increased in size as the sensitivity was improved, relying mainly upon the improvement of the strength of the magnetic field, and thus leakage of the magnetic field and the necessity of providing a strong floor to support the apparatus had to be considered. In addition, there arose considerations that caused the costs of the superconducting magnet to increase. In this method, improvement of the sensitivity reaches generally 21T, which is the upper limit value under the constraint of the critical magnetic field of superconducting material. Therefore, technology to improve the detection sensitivity by a novel measure that does not rely upon the magnetic field strength has been anticipated in order to achieve greater improvement of the sensitivity.

As has been described above, a method of supersensitive measurement using a solenoid coil can be performed only with a minute quantity of a specific sample and with the use of a specific detector probe, but it cannot be applied to cell imaging due to the issue of resolution. As in the example disclosed in JP-A-11-248810, in a system in which a magnetic field was generated in the horizontal direction with a strong magnet and a NMR signal was detected with a solenoid coil, only a magnetic field less than 10T could be generated on the surface of a high temperature superconducting body, and the magnetic field in the portion of the sample was several Tesla at the highest. Therefore, using this method, it was impossible to generate a magnetic field not less than 11 Tesla, such as is required for the imaging of cells, or preferably, not less than 14.1 Tesla, in the desired sample space. Further, in using this method, it was very difficult to achieve a time-based stability of 1.0 Hz/h or less, that is required for the imaging of cells, due to the effect of a magnetic flux creeping phenomenon of the high temperature superconducting body. As regards the uniformity of the magnetic field required for analysis of protein, it was also difficult to achieve a uniformity of the magnetic field in the level less than 1.0 Hz in Proton nuclear magnetic resonance frequencies in a space of 10 mm (diameter)×10 mm (length), because of the non-uniformity caused by the process of manufacture of the high temperature superconducting bulk body material.

As has been described thus far, in the related technical field, while development of a breakthrough technology for accommodating the need for analysis of a protein was required, a novel solution for greater improvement of the sensitivity at the present time that the limit of improvement of sensitivity in the magnetic field is already attained has been expected.

In the case where analysis using on-site observation of the metabolic reaction in the cells or imaging of a protein information network, which is considered to be increasingly required in the future, is performed effectively and accurately, experientially, it is desirable to be able to effect a measurement at 600 to 900 MHz, with 14 to 21 T at the central magnetic field, and with an appropriate amount of sample, and to obtain a sensitivity of measurement higher than the status quo and simultaneously to increase the throughput.

SUMMARY OF THE INVENTION

The object of the present invention is to provide a novel nuclear magnetic resonance analyzing apparatus, in which a sampling chamber of 1 to 30 mm in diameter that can accommodate the needs of biological study, is used, and in which the sensitivity for measuring the NMR signal is increased to a value in the order of at least three times the conventional value at least at 600 MHz (14.1T), and in which a time-based stability and spatial uniformity of the superconducting magnet required for imaging analysis in the cell can be provided.

In the construction of the present invention, the operating temperature of the system is not limited to 4.2 K. It is also possible to achieve extreme performance by the application of the present invention, and, depending on the applications, operation at 1.8K at 21.1T or 900 MHz, which used to be the limit of the magnetic field, is also possible. In such a case, improvement of the sensitivity to a value three times that currently available is possible, and thus breakthrough of the limit of detection sensitivity by the magnetic field strength, which used to be impossible, can be achieved for the first time.

The inventors have investigated the problems common to the present high-resolution nuclear magnetic resonance imaging apparatuses, and they have devised a countermeasure therefor by persevering in their study. The present nuclear magnetic resonance apparatus has been developed on the basis of a method in which a solution sample is placed at the center of a multi-layer hollow solenoid coil having superior uniformity in the generation of magnetic fields, which are detected by a saddle-type or a birdcage antenna, in order to successfully balance the considerations of cost and installability. Historically, with the development of NMR from a magnetic field of less than 400 MHz in association with the development of a measurement technology and an analytical technique, the measurement sensitivity has been improved by intensifying the central magnetic field while maintaining the basic system of the NMR. Recently, an example of using a superconducting birdcage antenna to reduce heat noise also has been reported. We have repeatedly studied a method of intensifying the signal strength more remarkably than that of the prior apparatuses, while maintaining the magnetic field strength at the same level. As a consequence, we found that this problem can be solved according to a novel method, which will be described below.

The point is to increase the sensitivity by using a detector coil of a solenoid system having a sample space of 1 to 30 mm in diameter and 20 to 60 mm in height with at least 400 MHz, and preferably, in the order of 600 MHz to 900 MHz in Proton nuclear magnetic resonance frequencies. In principle, improvement of the sensitivity of at least about 2.5 to 2.8 times must be expected by the difference among the form factors of the detector coil, and further improvement is expected by other factors, whereby the data accumulation time required for imaging may be reduced to one-tenth or less.

The sample is inserted from the top of the apparatus in the vertical direction. In order to detect the NMR signal sensitively using a solenoid coil having an axis oriented in the vertical direction, it is necessary to orient the magnetic field generated by the superconducting magnet in the horizontal direction so as to be able to dispose the sample in the center of a uniform magnetic field. Therefore, the construction of the superconducting magnet differs from that of a simple solenoid magnet, and it is required to be constructed of a laterally divided pair of split magnets.

In order to be applied to a special analysis, such as imaging of metabolism or analysis of a protein information network in a cell or between cells, as described above, it is necessary to optimally design and manufacture a superconducting magnet to have 1.0 Hz/h in Proton nuclear magnetic resonance frequencies in terms of time-based stability, and 1.0 Hz or less in terms of the spatial uniformity in the sample space. It is a design that is at least one digit stricter than that in the currently available technology, and it is not in a range that can be realized by simply combining known technology. Therefore, each split magnet is subjected to a sufficient design to achieve generation of a magnetic field with a high level of accuracy of 0.000 ppm, which is the limit of the effective number of digits on the computer, and then it is constructed by optimally arranging and combining a coil formed of high magnetic field superconducting wire, such as $Nb_3Sn$, and a low magnetic field superconducting coil formed of NbTi superconducting wire.

There is no example of a high resolution NMR apparatus using split magnets. After repeated studies, the inventors have found that the construction of this apparatus can achieve a time-based stability and spatial stability that can be applied to bioinfomatic analysis on the cell scale for the first time in the world, that is, 1.0 Hz or less in the sample space and 1.0 Hz or less per hour in Proton nuclear magnetic resonance frequencies. With the magnet optimization technology that we have developed, the design of a complicated split coil system capable of producing a uniform magnetic field, which has been difficult heretofore, was made possible. We found that the size of the magnet portion, including the lower temperature container, can be arranged within generally 1 m in width and 1 m in height per set, and thus an experimental apparatus having a high degree of positioning and occupying only a small space can be constructed, while keeping the leakage of magnetic fields as low as possible. Thus, a "nuclear magnetic resonance imaging apparatus" having a high throughput and enjoying generally 10 times the data accumulation time can be provided.

In other words, the problems heretofore encountered can be solved by a nuclear magnetic resonance imaging apparatus including a superconducting magnet, a gradient magnetic field coil, a high frequency emitting coil, and a receiving coil, wherein a biosample, such as cells, organic tissues, or laboratory small animals, is inserted into a sample chamber of generally 1 to 30 mm in diameter, the superconducting magnet consists of laterally divided split magnets, the direction of the magnetic field generated by the magnet is generally horizontal, the receiving coil is a solenoid coil, and the spatial resolution in imaging of a biosample is not more than one-tenth of a cell that forms the biosample.

The problems heretofore encountered can be solved by a nuclear magnetic resonance imaging apparatus including a superconducting magnet, a gradient magnetic field coil, a high frequency emitting coil, and a receiving coil, wherein a biosample, such as cells, organic tissues, or laboratory small animals, is inserted into a sample chamber of generally 1 to 30 mm in diameter, the superconducting magnet consists of laterally divided split magnets, the direction of the magnetic field generated by the magnet is generally horizontal, the receiving coil is a solenoid coil, the sample is inserted from a direction orthogonal to the direction of the magnetic field in a generally horizontal direction, and the spatial resolution in imaging of the biosample is not more than one-tenth of a cell that forms the biosample.

The problems heretofore encountered can be solved by a nuclear magnetic resonance imaging apparatus including a superconducting magnet, a gradient magnetic field coil, a high frequency emitting coil, and a receiving coil, wherein a biosample, such as cells, organic tissues, or laboratory small animals, is inserted into a sample chamber of generally 1 to 30 mm in diameter, the superconducting magnet consists of laterally divided split magnets, the direction of the magnetic field generated by the magnet is generally horizontal, the receiving coil is a solenoid coil, the sample is inserted from a direction orthogonal to the direction of the magnetic field in a generally vertical direction, and the spatial resolution in imaging of the biosample is not more than one-tenth of a cell that forms the biosample.

The problem heretofore encountered can be solved by a nuclear magnetic resonance imaging apparatus including a superconducting magnet, a gradient magnetic field coil, a high frequency emitting coil, and a receiving coil, wherein a protein sample dissolved into water or the like is inserted into a sample tube, the superconducting magnet consists of laterally divided split magnets, the direction of the magnetic field generated by the magnet is generally horizontal, the receiving coil is a solenoid coil, and the sample is inserted from a direction orthogonal to the direction of the magnetic field in a generally vertical direction. With this apparatus, a high-grade protein crystal can be grown in the magnetic field, the spatial resolution being sufficient for observing the surface property of the protein crystal when the protein dissolved in the liquid is crystallized; and, the growing velocity and growing surface of the crystal can be observed on-site by nuclear magnetic resonance imaging, and the crystal growth conditions can be adequately controlled by obtained information.

Further, the problem heretofore encountered can be solved by a nuclear magnetic resonance imaging apparatus wherein a stationary magnetic field generated by the superconducting magnet is not less than 11 T, and, more preferably, not less than 14.1 T, variations per hour in Proton nuclear magnetic resonance frequencies due to variations in the stationary magnetic field are not more than 1.0 Hz, and the uniformity of the stationary magnetic field in the sample space is not more than 1.0 Hz in Proton nuclear magnetic resonance frequencies.

Still further, the problems heretofore encountered can be solved by a nuclear magnetic resonance imaging apparatus, wherein the imaging spatial resolution is not more than 1 micron, and, more preferably, not more than 0.1 micron.

As has been described thus far, with the nuclear magnetic resonance imaging apparatus, transmission of protein information network information in the organic tissues can be imaged as two-dimensional or three-dimensional image information, which can contribute to developments in the study of molecular biology.

In the nuclear magnetic resonance imaging apparatus, the receiving coil is formed of an oxide high temperature superconducting material, or of magnesium diboride, whereby coil temperatures between 5 K and 40 K inclusive enable supersensitive and high-resolution measurement.

In a supersensitive nuclear magnetic resonance imaging method, for example, when the nuclear magnet resonance frequency is 14.1 T (600 MHz), the chemical shift of a Proton is approximately 10 ppm in line width, or 6000 Hz, and thus resolutions on the $\mu$m scale cannot be obtained without modification. Therefore, the resolution is increased by spectrally factorizing the Proton NMR before imaging. In other words, a gradient magnetic field is applied to give positional information to a nuclear spin, and then the Proton NMR spectrum is measured to obtain a two-dimensional image of a specific spectrum line. Since the line width of the specific spectrum line is in the order of 0.01 ppm (0.014 G), the spatial resolution can be drastically increased. For example, when a gradient magnetic field of 280 G is given to the sample space of 10 mm, and the spatial distribution of a specific spectrum line is observed, a spatial resolution of 0.5 micron can be obtained. In order to enable such measurement, a magnetic field uniformity of 0.001 ppm is required in the measurement space of 600 MHz (14.1T), and in addition, effective accumulation of a faint spectrum by the supersensitive measuring method is required; and, thus, a solenoid signal detector coil in accordance with the present invention is essential.

DESCRIPTION OF PREFERRED EMBODIMENTS (Embodiment 1)

Figure 1:
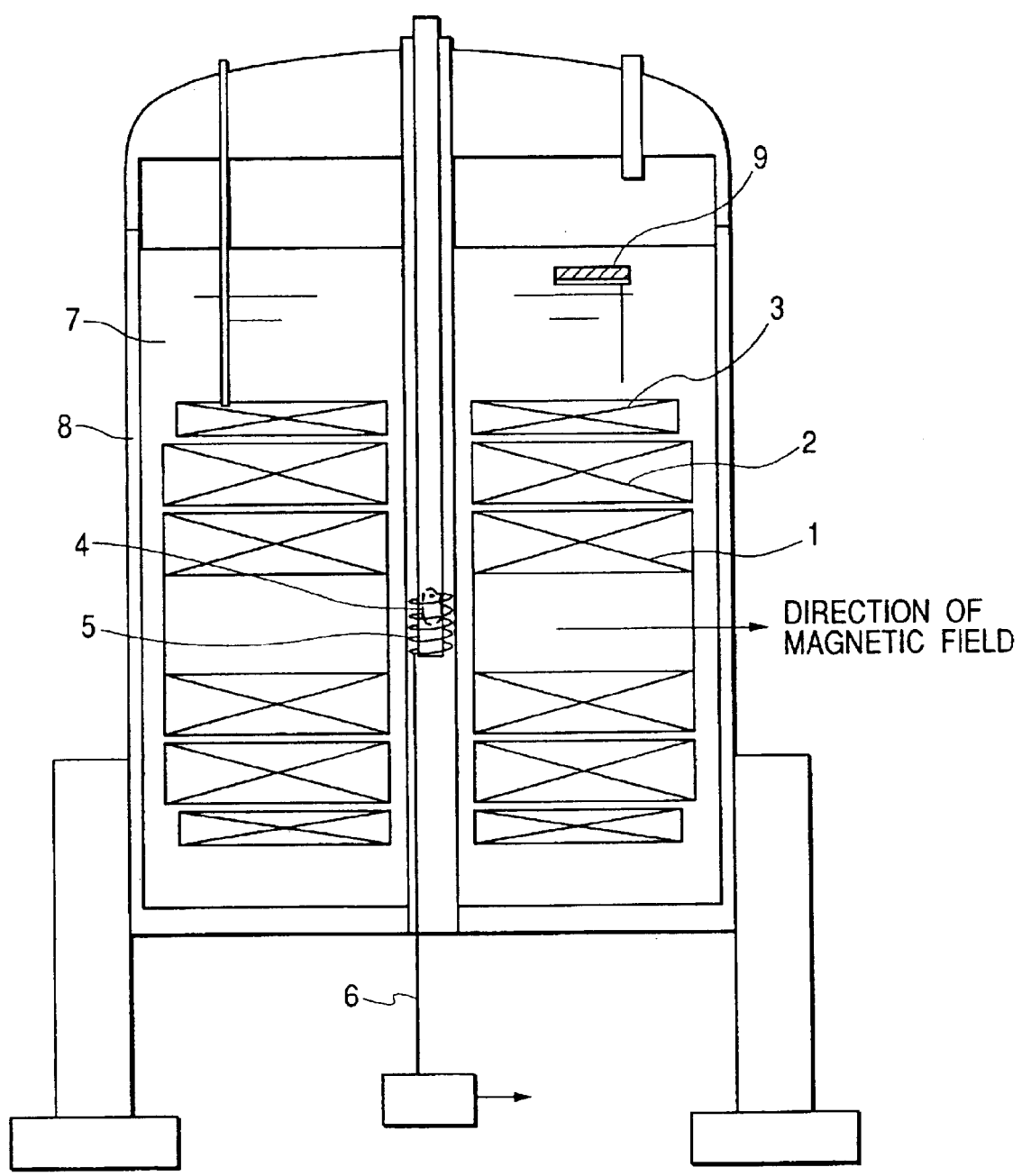
FIG. 1 is a diagram showing an example of the NMR imaging apparatus according to the present invention.

The first embodiment of the present invention is shown in FIG. 1. In the superconducting magnets 1, 2, 3 the coils are formed in such a manner that the inner side, that is the side closer to the sample, is formed of a material having a higher superconducting critical magnetic field. or example, the superconducting magnet 1 is formed of $Nb_3Al$, the superconducting magnet 2 is formed of $Nb_3Sn$, and the superconducting magnet 3 is formed of NbTi; and, they can be optically combined to obtain desired values of coil-generated magnetic field and of uniformity as needed. For example, a Bi-type such as $Bl_2Sr_2CaCu_2O_9$ and the like, or superconducting material, such as, $Y_1Ba_5Cu_3O_7$ and the like, may be used, or $MgB_2$ and the like may also be used. The direction of generation of the magnetic fields of the supercoducting magnet 1, 2, 3 constructed of a combination thereof is horizontal.

In FIG. 1, the biosample 4, such as small animals, cells, and organic tissues, is inserted from the top of the apparatus into the center of the magnetic field in a vertically oriented glass container having magnetic properties equivalent to water and which is 1 to 30 mm in diameter. The magnetic field is applied to the sample 4 in the lateral direction from the side. Therefore, each superconducting magnet 1, 2, 3 is wound in the state of a solenoid with the axis thereof oriented in the horizontal direction, and which is disposed laterally symmetrically. The maximum width of the magnet 1, 2, 3 is 400 mm, and the maximum height is 700 mm, which will allow for a compact arrangement.

At the center of the magnet 1, 2, 3, the uniformity of the magnetic field is adjusted to a value not greater than 0.001 ppm, which corresponds to 0.5 Hz or less when represented by Proton nuclear magnetic resonance frequencies, and the time based stability is not greater than 0.001 ppm/h, which corresponds to 0.5 Hz/h or less, when represented by Proton nuclear magnetic field resonance frequencies. In this case, a coil for uniformity adjustment may be disposed in the vicinity of the center of the magnetic field as needed.

A conducting wire may be used for adjustment at a constant temperature portion, or another superconducting wire may be used for adjustment at the lower temperature portion, or a combination thereof may be used for adjustment. For example, when it is used for NMR of 600 MHz in the Proton nuclear magnetic resonance frequencies, the central magnetic field is generally 14.1 T and the uniformity of the magnetic field is not greeter than 0.5 Hz in the sphere of 18 mm when represented by the Proton nuclear magnetic resonance frequencies. Under such conditions, the operating temperature of the coil is 4.2 K and the pumping of liquid helium is not necessary, whereby the operation is easy. The sample 4 is inserted vertically.

According to this method, since the magnetic fields are generated in the horizontal direction and the sample 4 is inserted from the top in the vertical direction, there is no possibility that a solution, such as organic tissues in a test tube, will spill over. Further, since it is constructed so that the detector coil 5 can be inserted from below, a sufficient space for a sample 4 can be secured, and thus the sample space can be used as efficiently as possible for a measurement that requires a given sensitivity for analyzing a biosample 4. Even when the detector coil system is cooled to low temperatures, such an arrangement allows various conditions in imaging of the information network of a protein in living organisms to be easily changed.

A copper solenoid coil maintained at ordinary temperatures, or a solenoid coil formed of Y-oxide superconducting material or $MgB2$ cooled to 5 to 20 K is used for detecting the NMR signal. It is inserted from the bottom of the apparatus into the center of the magnetic field as a detector coil 5 for antennas, and it is disposed around a glass tube containing a sample therein so as to send a detected signal to the outside through a signal cable 6. Since it is inserted from the bottom of the apparatus, a wide sample space can be secured, and vibration noise from the measurement system to the sample can be reduced.

The superconducting magnet 1, 2, 3 is held at the permanent current mode by the permanent current changeover switch 9, and time-based variations of the magnetic field are adjusted to 0.5 Hz per hour or less. The superconducting magnet 1, 2, 3 is soaked in liquid helium 7 and held at low temperatures. Consumption of helium is cut down by employing a double structure in which the outside is covered by liquid nitrogen 8. It is also possible to employ a refrigerating machine that has no vibration problem, such as a pulse tube refrigerator, to cool the superconducting magnet directly, instead of cooling it down by Use of liquid helium 7. Reduction of leakage of the magnetic field around the magnet 1, 2, 3 is important from the viewpoint of the installability and safety of the apparatus, and so a magnet structure including a magnet shield is realized that meets the installation conditions.

Figure 7:
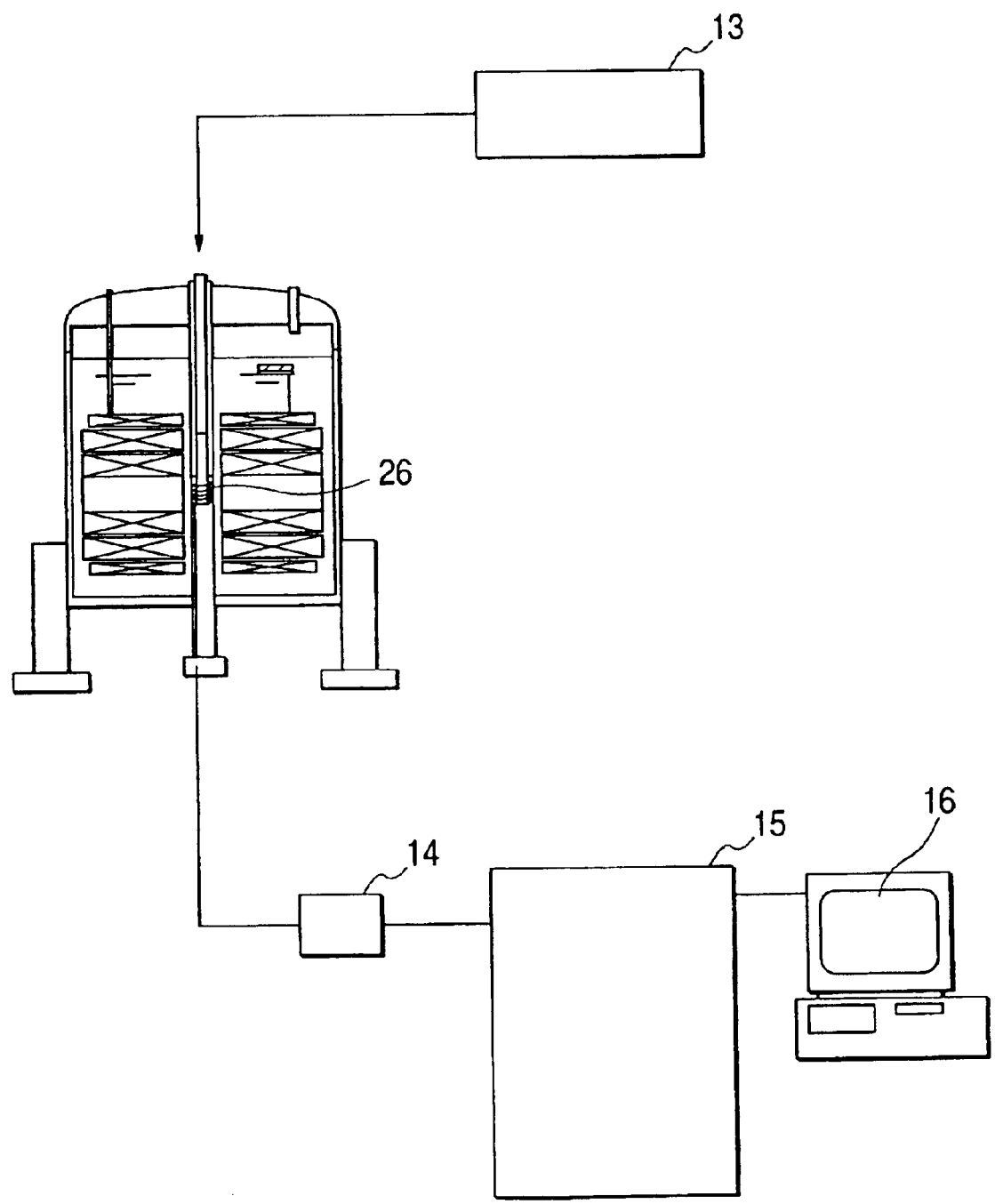
FIG. 7 is a schematic diagram of the in-the-magnetic-field crystal growth apparatus according to the present invention.

As has been described thus far, according to the arrangement of the present embodiment, the central magnetic field of 14.1 T, which corresponds to 600 MHz in Proton nuclear magnetic resonance frequencies, was obtained. As shown in FIG. 7, it is about three times that obtained in the previously known NMR system in signal/noise ratio (S/N ratio); and, when measurements of the NMR signal accumulation time required for imaging the cell tissue from the same sample are compared, the data accumulation speed in the same level was doubled. Further, the uniformity of the magnetic field of 0.001 ppm enabled an improvement of the imaging resolution, and a spatial resolution of 0.5 $\mu$m, which is one digit smaller than the cell size of 1 to 10 $\mu$m, was realized.

In the supersensitive nuclear magnetic resonance imaging method according to the present invention, when the nuclear magnetic resonance frequency is 14.1 T (600 MHz), for example, the chemical shift of a Proton, or the line width, is approximately 10 ppm, which corresponds to 6000 Hz, and thus resolution; on a $\mu$m scale could not be obtained without modification. Therefore, the resolution was increased by spectrally factorizing the Proton NMR before imaging. In other words, a gradient magnetic field was applied to give positional information to a nuclear spin, and then the Proton NMR spectrum was measured to obtain a two-dimensional image of a specific spectrum line. Since the line width of the specific spectrum line was in the order of 0.1 ppm (0.014 G), the spatial resolution could be drastically increased.

When a gradient magnetic field of 280 G was given to the sample space of 10 mm, and the spatial distribution of a specific spectrum line was observed, a spatial resolution of 0.5 micron could be obtained. In order to enable such measurement, the magnetic field uniformity of 0.001 ppm was required in the measurement space of 600 MHz (14.1T), and, in addition, an effective accumulation of a faint spectrum by the supersensitive measuring method was required; and, thus the solenoid signal detector coil jot the present invention was essential. This enabled observation of a metabolic reaction of protein in the cell by imaging. The five gauss line of the magnetic field leaked from the apparatus was 2 m in the vertical direction and 3 m in the horizontal direction at the maximum. This enabled installation of the apparatus without providing a specific building.

(Embodiment 2)

Figure 2:
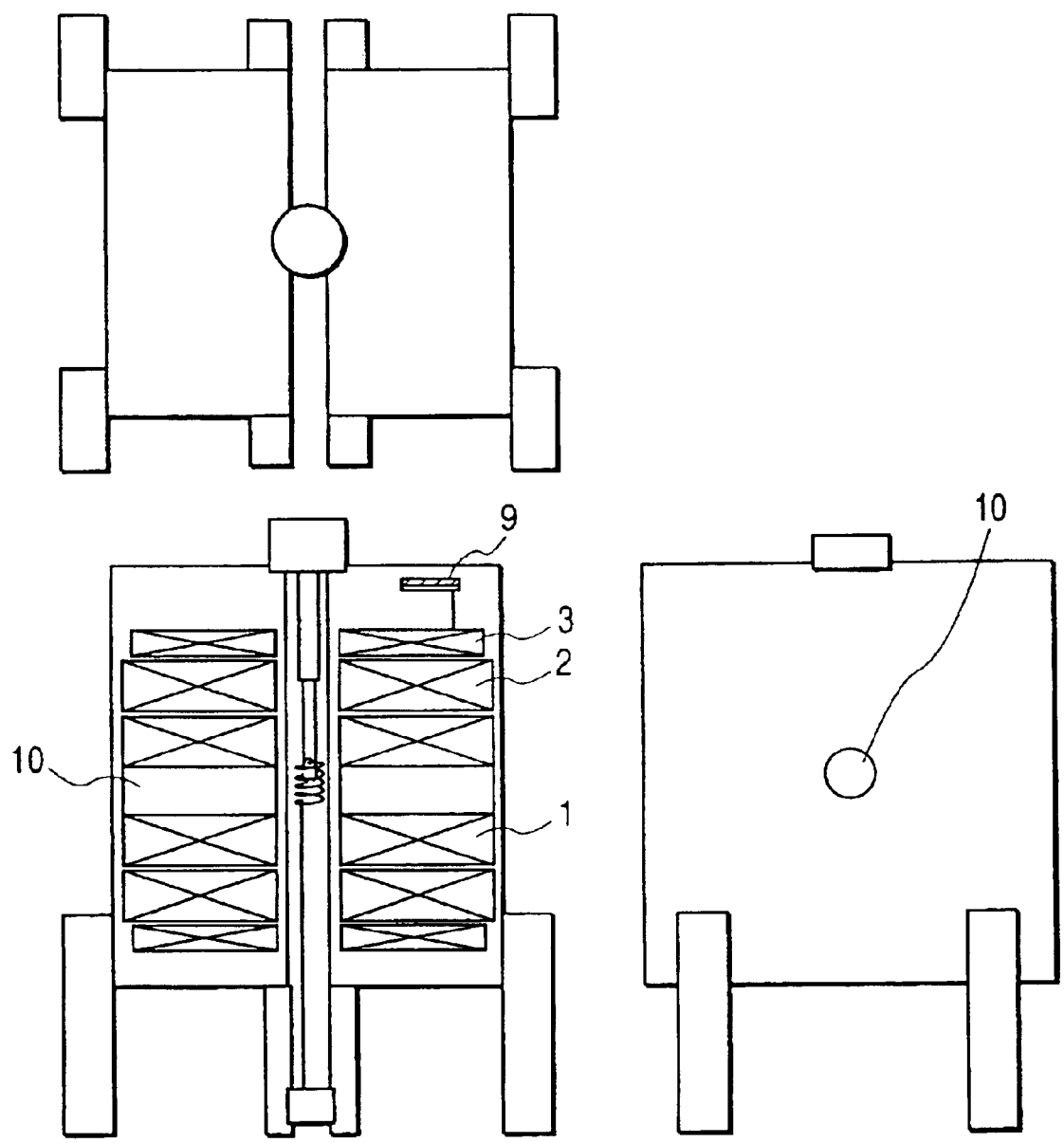
FIG. 2 shows diagrammatic top, front and side views of the construction of an example of the open-type NMR imaging apparatus according to the present invention.

The second embodiment of the present invention is shown in FIG. 2. In this embodiment, the construction is generally identical to the first embodiment, but the low temperature container is divided by the left and right superconducting magnets to provide an openness to the available space for the user. In other words, since there is an open space 10 around the sample chamber, unlike the hermetical sample space in the previously known construction, the dynamic behavior of the liming organisms, such as photosynthesis, can be measured, while performing light irradiation or laser beam irradiation on the sample 4 easily. Since the dynamic NMR signal can be observed in this manner, for example, the signal transmission or reaction of photosynthesis of the protein can be inspected.

When performing such special experiments, liquid helium 7 is pumped to cool down and operate the apparatus at 1.8 K, so that the superconducting magnet 1, 2, 3 can be operated approximately at 900 MHz (21.1 T) at the central magnetic field. The detection sensitivity in this case is equivalent to the NMR of 2 GHz or higher when converted to the previously known NMR apparatus shown in FIG. 8, which significantly exceeds the critical magnetic field of the traditional superconducting material. Therefore, though such detection sensitivity could not be achieved heretofore, a high level of detection sensitivity, which could not previously be achieved, can be realized easily at magnetic field strengths between 600 and 900 MHz (21.1T). In this case, as well, the magnetic fields that leaked from the apparatus in the vertical direction are significantly different from those in the case of the NMR apparatus of 900 MHz class in the previously known apparatus, and, in accordance with the present invention, it was 3 m in the vertical direction, and 4.5 m at the maximum in the axial direction of the coil (horizontal direction).

(Embodiment 3)

Figure 3:
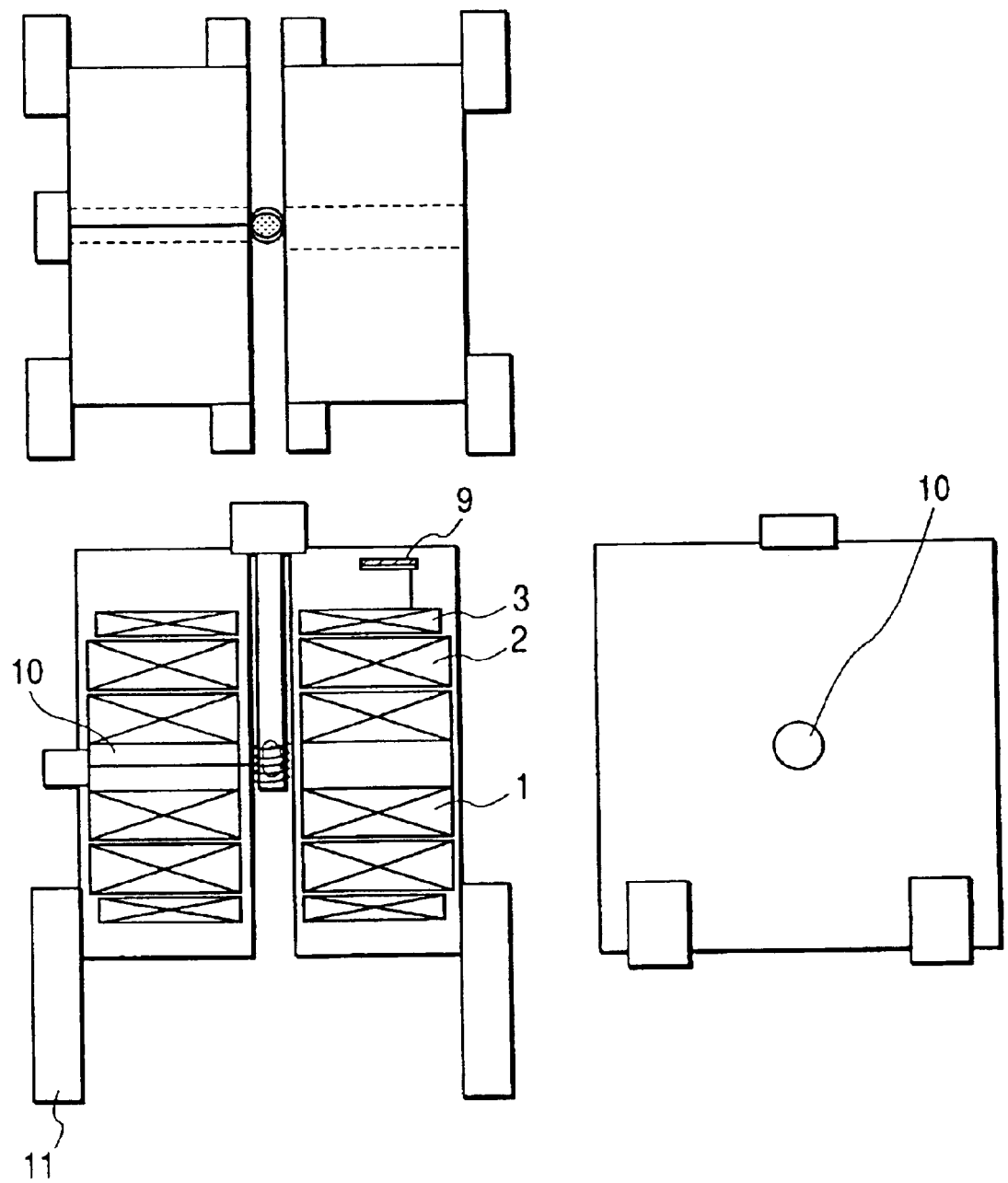
FIG. 3 shows diagrammatic top, front and side views of the construction of an example of the imaging apparatus according to the present invention.

A third embodiment of the present invention is shown in FIG. 3 in this embodiment, the biosample 4 is inserted into the apparatus from the top, and the measurement probe is inserted from the side. In this arrangement, the frame 11, that is provided with an anti-vibration device, can be lowered; and, thus the height of the apparatus cars be lowered, whereby the operability is improved, and vibrations propagated from the floor to the apparatus can be reduced. Therefore, an economically effective system, which is superior in installability and maintainability, can be provided.

(Embodiment 4)

Figure 4:
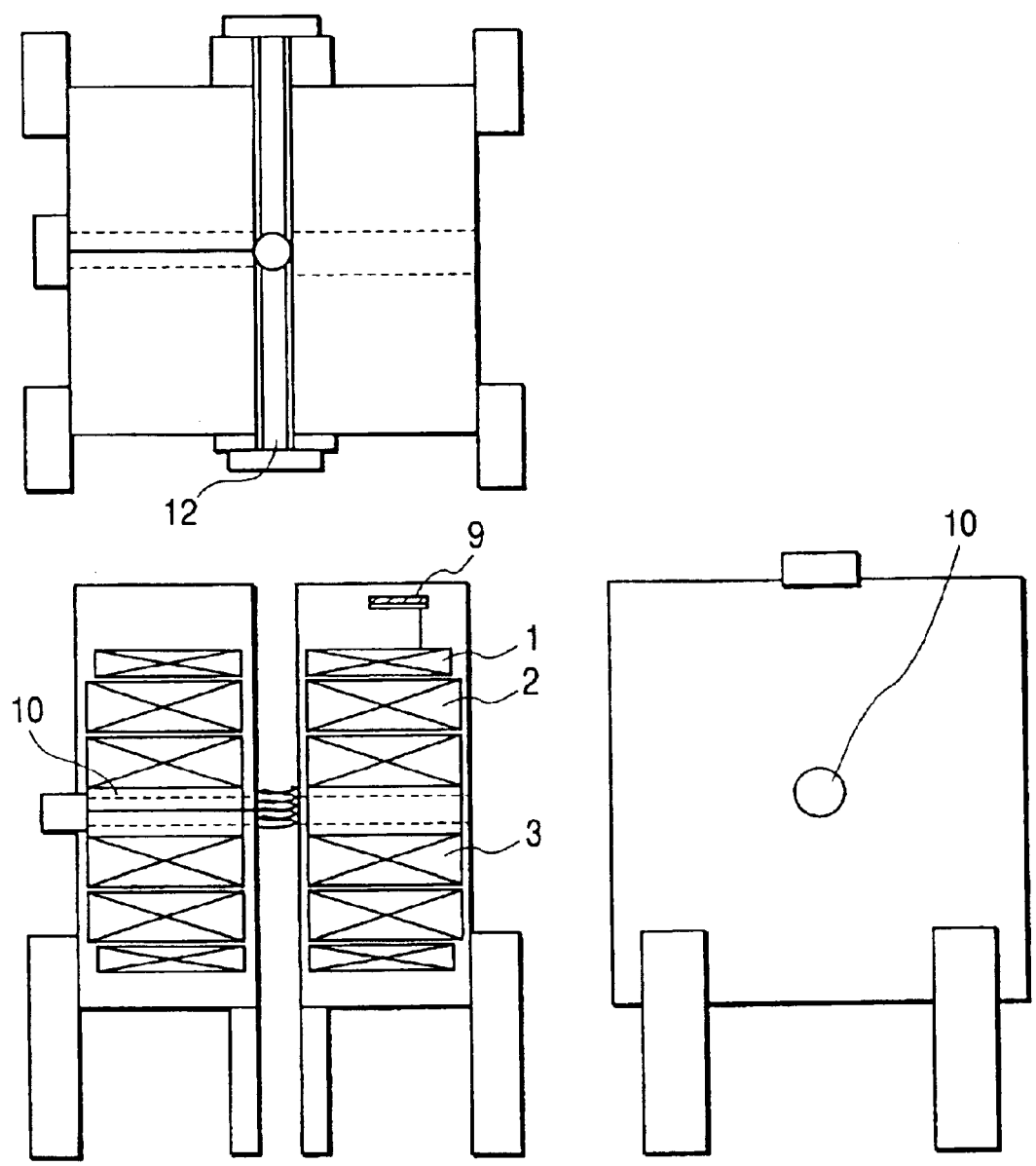
FIG. 4 shows diagrammatic top, front and side views of the construction of an example of the NMR imaging apparatus according to the present invention.

The fourth embodiment of the present invention is shown in FIG. 4. In this embodiment, the biosample 4 is inserted into the apparatus from the side, and the measurement probe is inserted through the through hole 12 formed on the other side. In this arrangement, the height of the apparatus can be lowered so that it can be used even when there is a limit in the height of the ceiling, whereby the operability is significantly improved and vibrations propagated from the floor to the apparatus can be reduced. Therefore, an economically effective system, which is superior in installability and maintainability, can be provided.

(Embodiment 5)

Figure 5:
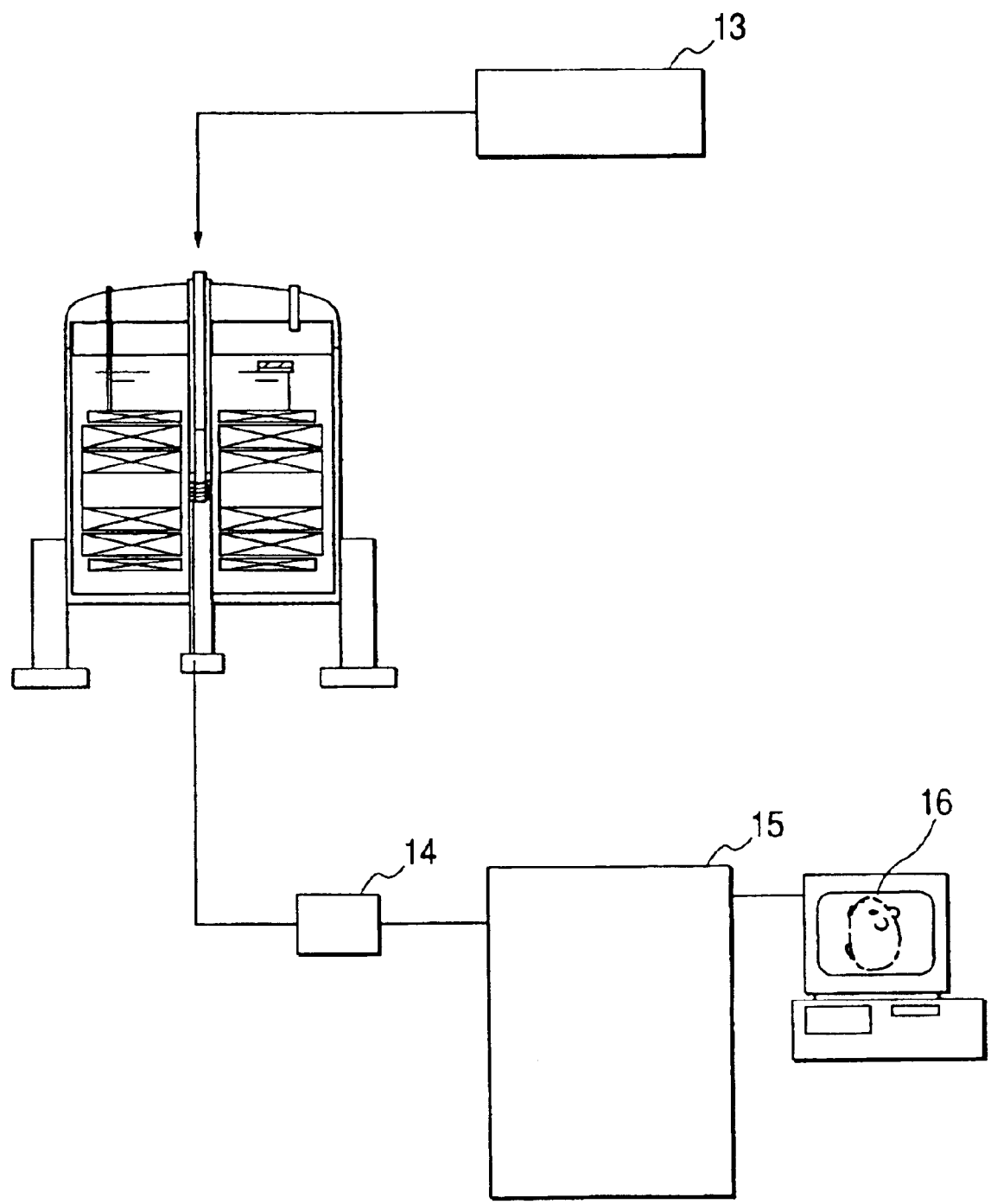
FIG. 5 is a schematic diagram of the NMR imaging system according to the present invention.

The fifth embodiment of the present invention is shown in FIG. 5. The biosample 4 being sent to the sample chamber, is maintained in a living state by the use of an oxygen supply unit 13. The NMR signal is sent to the controller 15 via a preamplifier 14. Various types of pulse sequences are applied to receive the NMR signal. The pulse is emitted as needed, and the pulse sequence is combined with a gradient magnetic field and imaged, and then sent to the display 15.

It is also possible to use the preamplifier 14, after being cooled to temperatures close to that of liquid nitrogen. In order to reduce heat noise in the signal.

Figure 6:
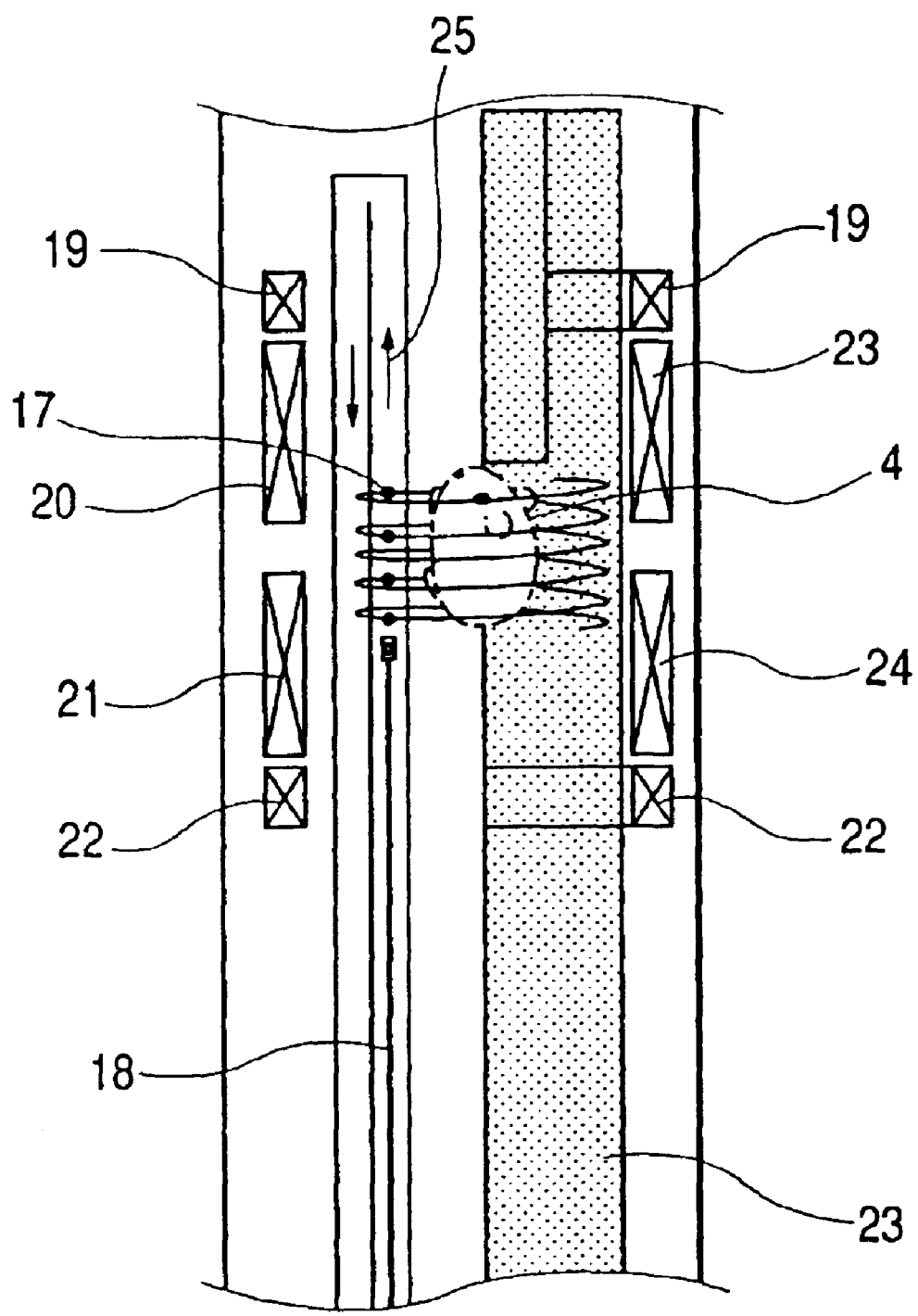
FIG. 6 is a diagram showing an example of the NMR signal detector coil according to the present invention.

FIG. 6 shows in more detail the structure of the detector probe according to the present invention. The biosample 4 is a small animal. The biosample 4 is inserted into a glass tube of 1 to 30 mm in diameter, having properties equivalent to water, and is disposed in the center of the magnetic field in the apparatus from below. The material of the solenoid detector coil 17 may be copper or superconducting wire. When superconducting wire is used, it is cooled generally to 4 to 20 K by helium gas 25. When copper wire is used, there is a case where it is maintained at ordinary temperatures.

The combination of 3-axis gradient magnetic field coils 19, 20, 21, 22, 23, 24, can generate a desired magnetic field gradient in the desired direction, and it used for imaging in combination with a pulse sequence. The detected signal is sent to the preamplifier via a lead 18.

According to the method of the present invention, the advantageously, sensitivity is increased to three-fold that used in the previously known method, thereby being superior in maintainability, and enabling the experiment of light irradiation described in Embodiment 2. In addition, since the sensitivity is increased to ten-fold that attained in the known method by forming the detector coil into a solenoid shape and providing it with a superconducting property, when it is put into practice with 900 MHz (21.1 T), for example, a detection sensitivity that corresponds to 2.7 GHz in the previously known method can be obtained, so that it is possible to effectively realize a detection sensitivity that was impossible to achieve in the past.

(Embodiment 6)

The sixth embodiment of the present invention is shown in FIG. 7. The basic structure of the apparatus is identical to Embodiment 5 of the present invention. In this embodiment, growth of a protein is carried out in the magnetic field. Crystal is grown while solidifying the protein 26 that is dissolved in the test tube. Conditions of crystal growth can be controlled by changing the flow rate of oxygen or the temperature conditions of the sample. A protein crystal of good quality can be grown by observing the process of growth under such circumstances by means of supersensitive imaging with spatial resolutions in the order of 0.5 micron.

COMPARATIVE EXAMPLE 1

Figure 8:
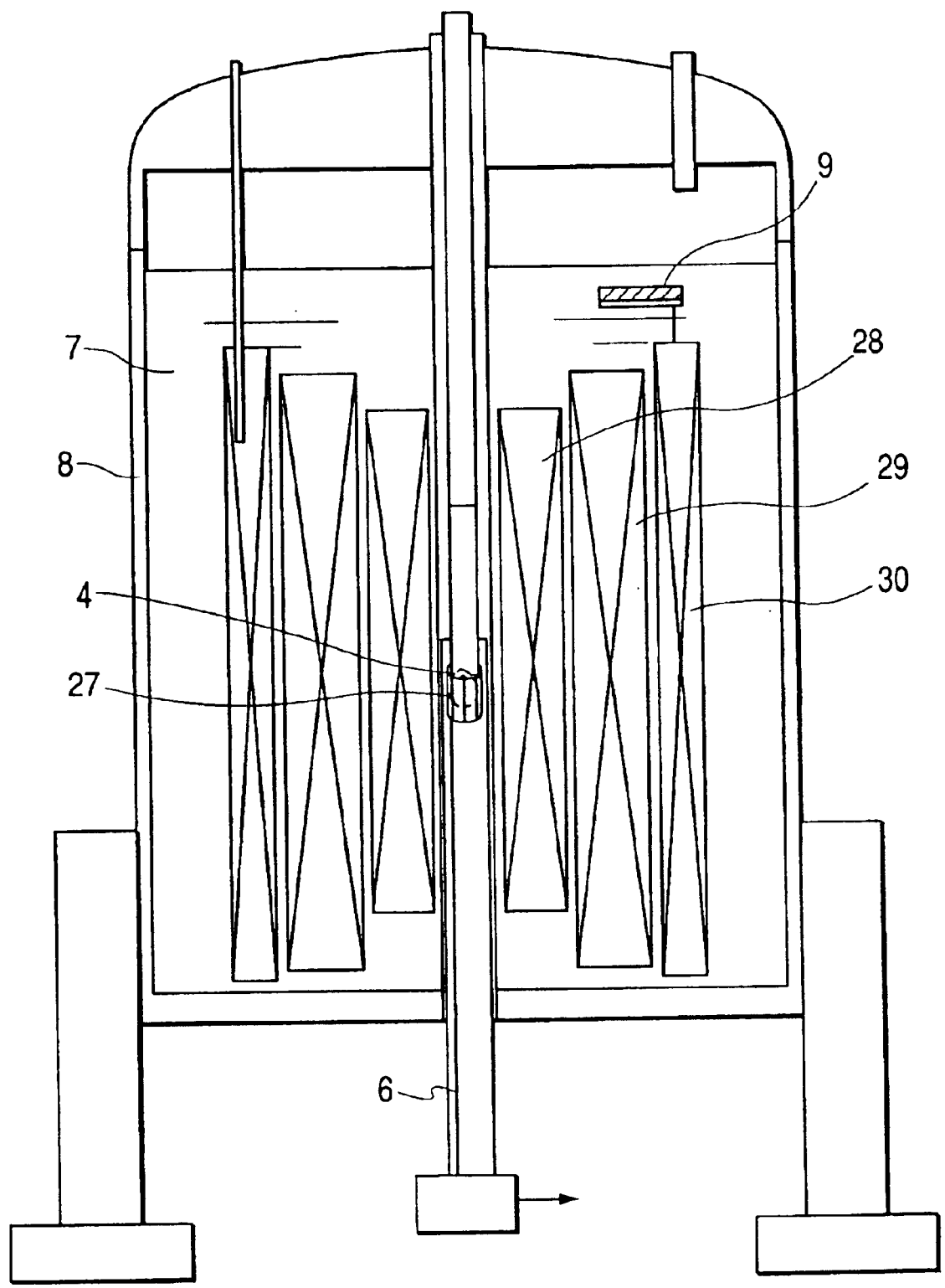
FIG. 8 is a diagram of the NMR imaging apparatus in the comparative example.

A typical construction of the known NMR imaging apparatus of 600 MHz class is shown in FIG. 8 as a comparative example, relative to the construction of the NMR apparatus in accordance with the present invention. The central magnetic field is 14.1 T. A birdcage receiving coil 27 and superconducting magnets 28, 29, 30 form a multi-layer hollow solenoid coil. The only way to improve the sensitivity to the same level as that is provided by the present invention in this detecting method is to increase the central magnetic field. However, at the present, the limit is 21 T. When employing the identical frequency (central magnetic field strength), the detection sensitivity is in the order of one-third the case of the present invention. The spatial resolution of image analysis is 40 $\mu$m, which is caused by insufficient uniformity in the magnetic field and low sensitivity.

COMPARATIVE EXAMPLE 2

Figure 9:
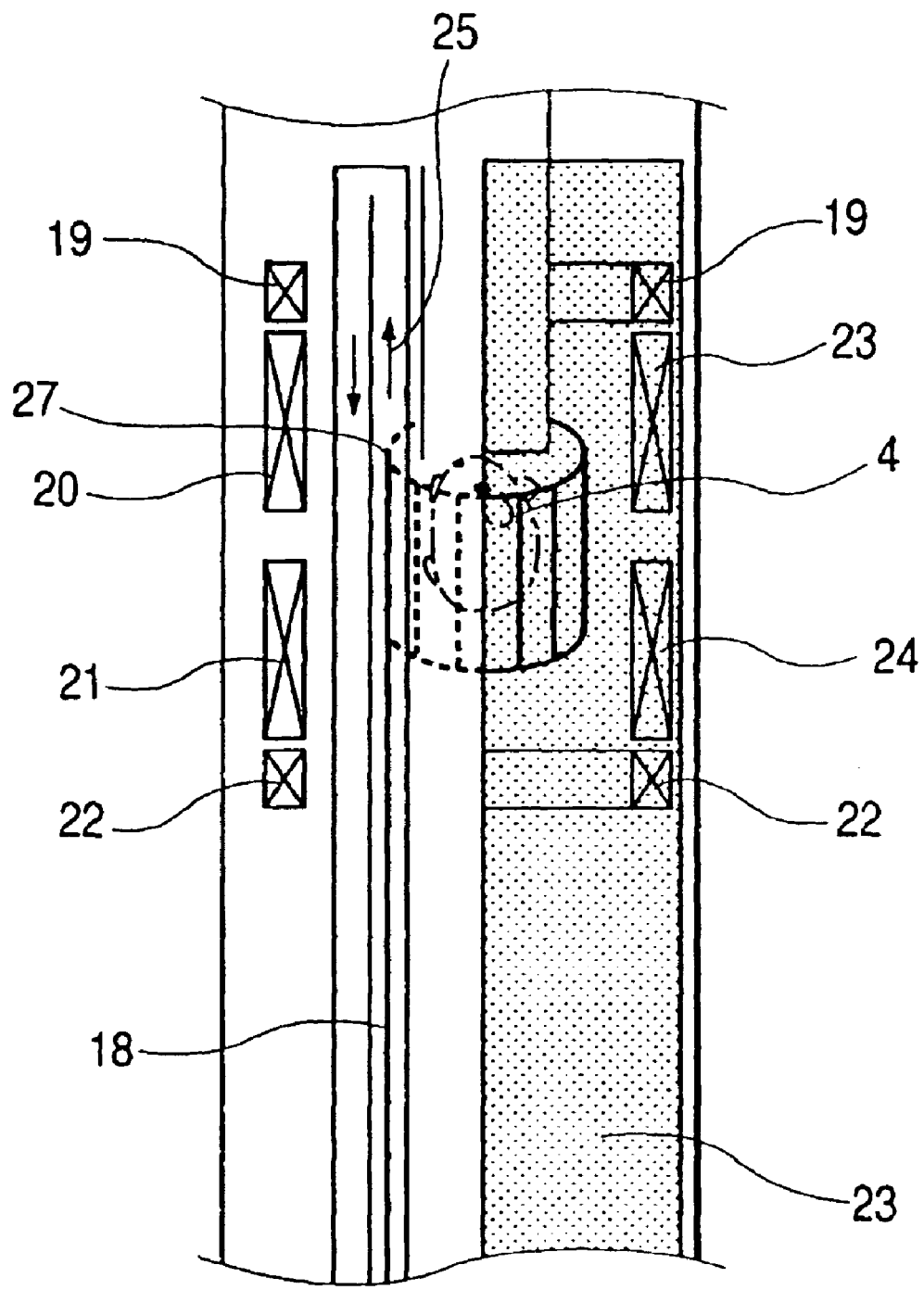
FIG. 9 is a diagram of the NMR signal detector coil in the comparative example.

The construction of the birdcage probe 27 in the known apparatus is shown in FIG. 9 as a comparative example, relative to the construction of the NMR apparatus in accordance with the present invention. Though there is a case in which a saddle type coil is used in the previously known construction, the same level of detection sensitivity as in Embodiment 1 of the present invention could not be obtained in a method combined with Comparative Example 1. The only way to improve the sensitivity in this detecting method is to decrease the temperature. Though a method of utilizing superconducting technology also has been proposed in the present circumstances, there arise problems of high costs and of maintainability. In addition, the detection sensitivity is as low as one-third that of the solenoid detector coil of the present invention, and thus it was difficult to obtain a sufficient spectrum intensity as required for imaging.

COMPARATIVE EXAMPLE 3

Figure 10:
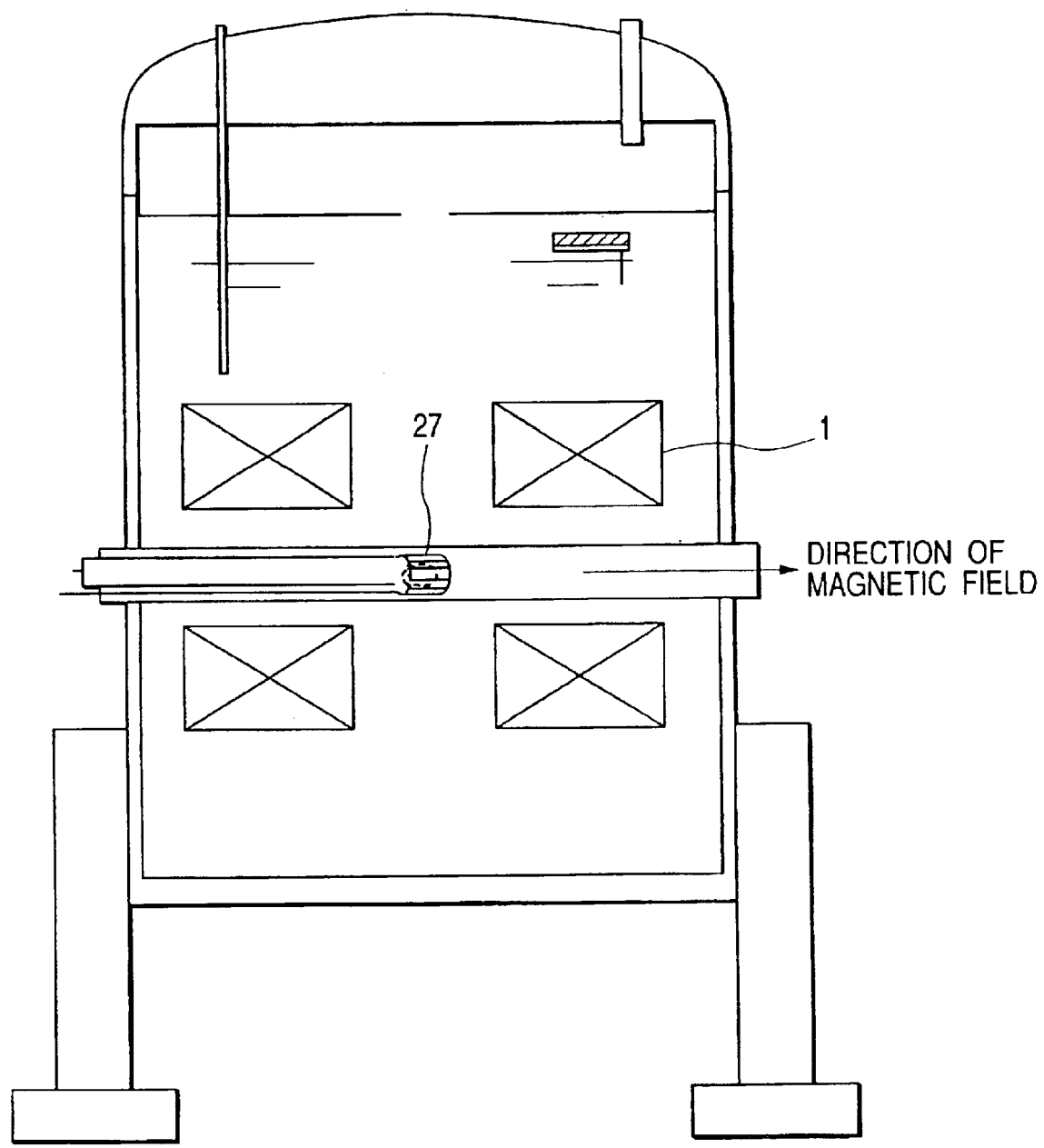
FIG. 10 is a diagram showing the combined construction of the NMR system in the comparative example.

A comparative example of the present invention is shown in FIG. 10. A known multi-purpose NMR solenoid coil generating a uniform magnetic field in the horizontal direction in the known horizontal-type magnetic field arrangement was combined with the known birdcage detector coil of Comparative Example 2, and a test tube containing a protein solution was inserted into the measuring portion through a communication hole formed in the horizontal direction. A nuclear magnetic resonance signal of generally 400 MHz was obtained by the magnetic field in the measuring portion, but a spatial nonuniformity that corresponds to an error of 20 Hz occurred in the magnetic field with the sample space of 10 mm in diameter and 20 mm in length. The nonuniformity of the magnetic field per hour was 10 Hz/h. These values are normal as a multi-purpose NMR apparatus, but the accuracy was one digit lower for high resolution imaging, which is an object of the present invention.

COMPARATIVE EXAMPLE 4

Figure 11:
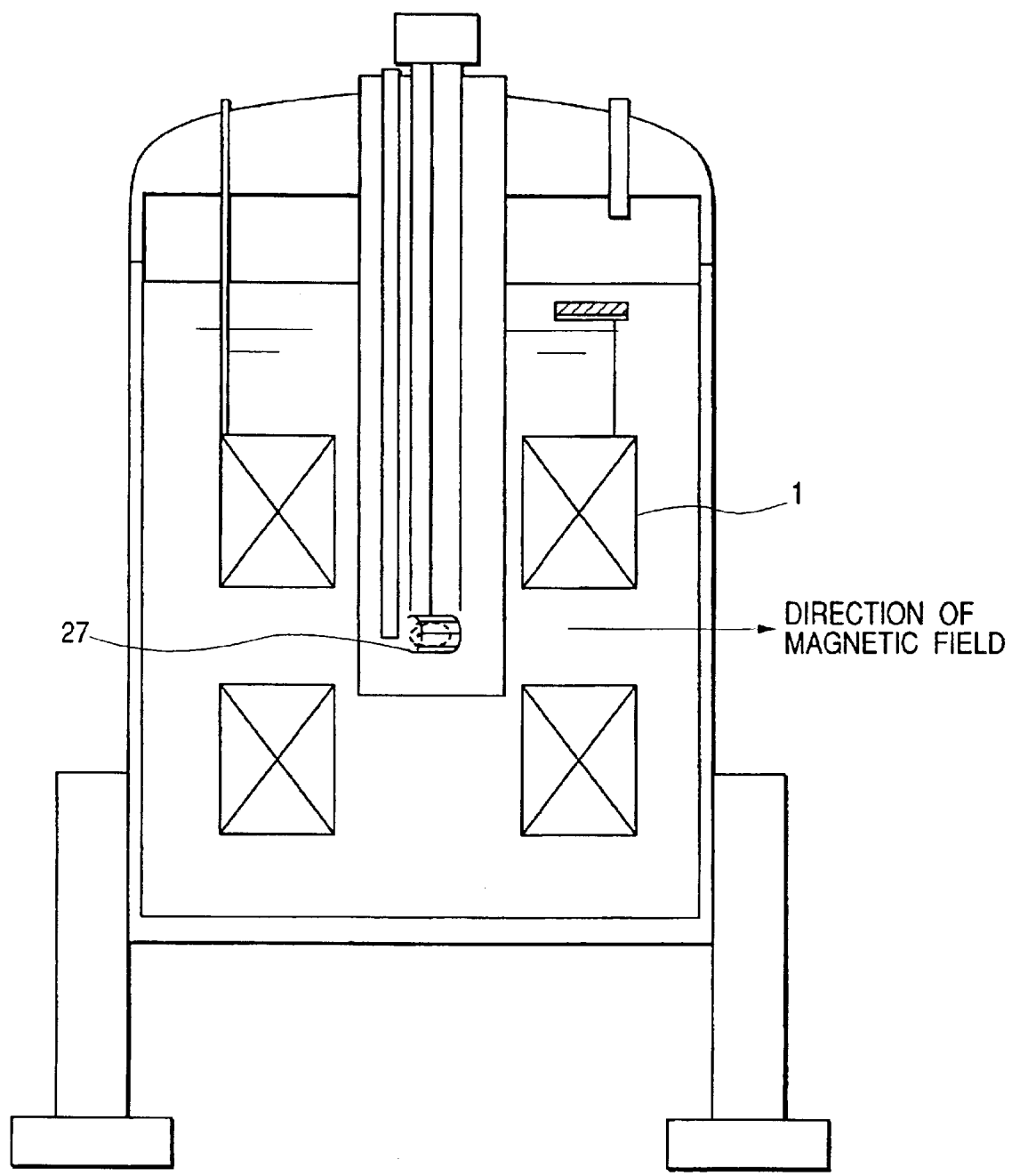
FIG. 11 is a diagram showing the combined construction of the NMR system in the comparative example.

A comparative example of the present invention is shown in FIG. 11. A known multi-purpose NMR solenoid coil generating a uniform magnetic field in the horizontal direction in the known horizontal-type magnetic field arrangement was combined with the known birdcage detector coil of Comparative Example 2 through the communication hole from the top of the apparatus to the measuring portion, and a protein solution is inserted into a test tube. Since the measuring instrument was inserted from the top, the through hole was upsized to 200 mm in maximum diameter. As a consequence, the central magnetic field strength was lowered. Even when efforts were made to adjust the magnetic field strength, only a nuclear magnetic resonance signal of 300 MHz could be obtained in the center of the magnetic field at the maximum. A nonuniform magnetic field corresponding to an error of 10 Hz was observed in the sample space of 10 mm in diameter and 20 mm in length. These values are normal as a multi-purpose NMR apparatus, but the accuracy was one digit lower for high resolution NMR imaging.

COMPARATIVE EXAMPLE 5

Figure 12:
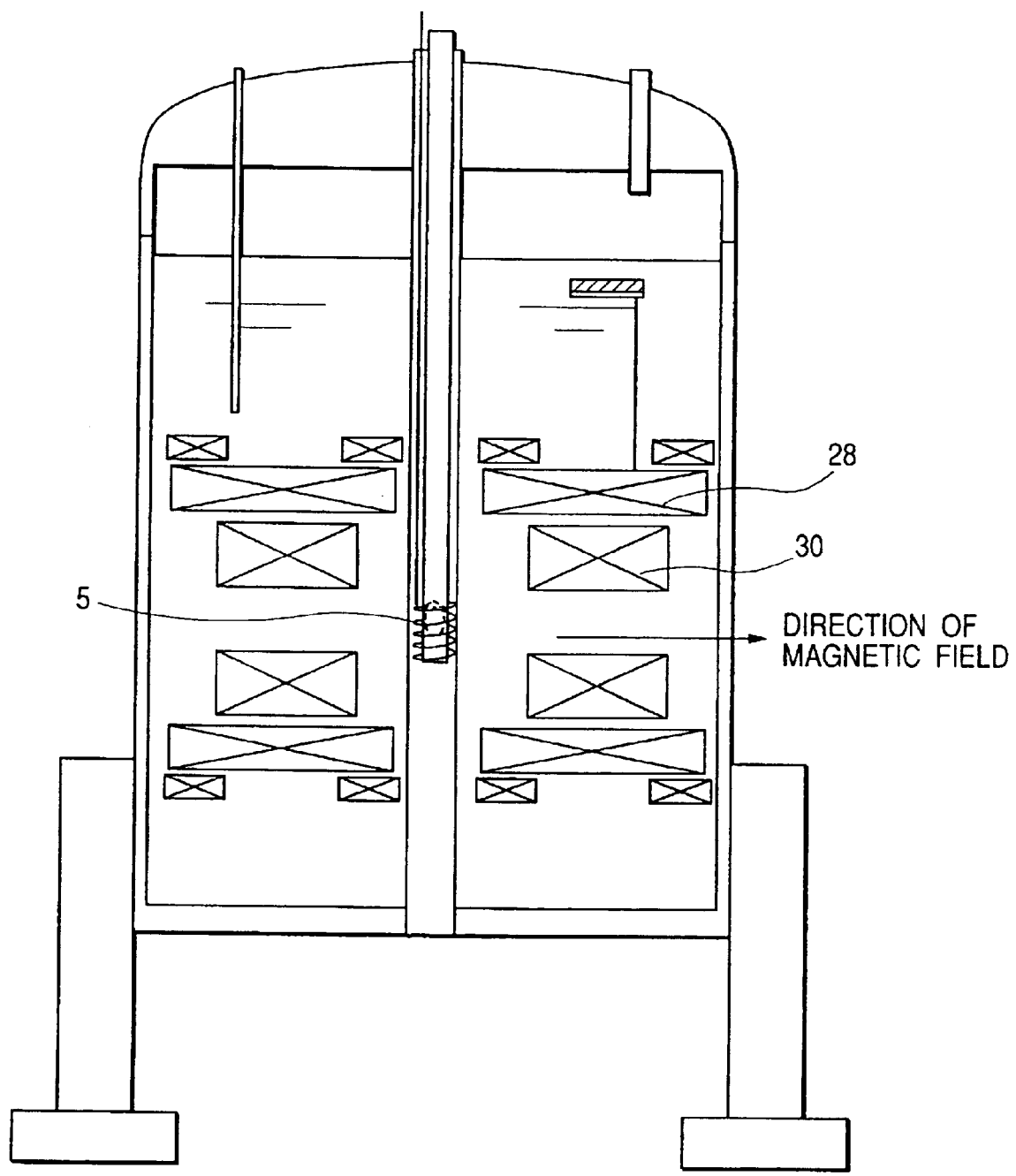
FIG. 12 is a diagram showing the combined construction of the NMR system in the comparative example.

A comparative example of the present invention is shown in FIG. 12. Two known multi-purpose NMR solenoid coils that generate uniform magnetic fields in the vertical direction of 18 T-class were combined in the known horizontal-type magnetic field arrangement. Then, they were combined with the solenoid detector coil of the present invention through a communication hole of 70 mm in diameter formed from the top of the apparatus to the measuring portion, and a small animal was inserted therein. All the measuring instruments and the solution sample were inserted from the top. The maximum magnetic field of each magnet was 18 T in the direction of the axes of the two magnetic systems. The time-based stability of the magnetic field was in the order of 0.001 ppm/h. However, the stationary magnetic field strength in the sample space was 7.5 T, and the uniformity of the sample space magnetic field was not more than 100 ppm, which represents a level that cannot be used for measurement as a high resolution NMR imaging apparatus.

COMPARATIVE EXAMPLE 6

Figure 13:
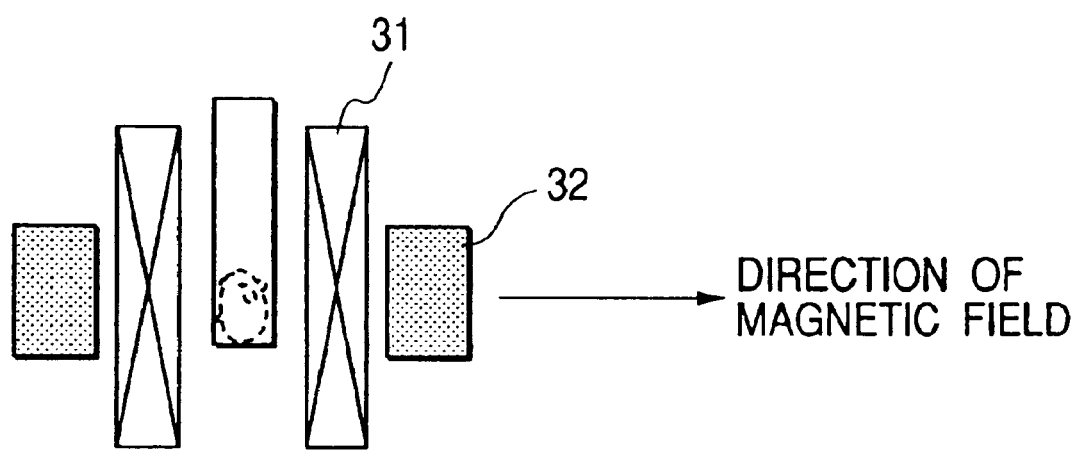
FIG. 13 is a diagram showing the combined construction of the NMR system in the comparative example.

A comparative example of the present invention is shown in FIG. 13. This is an example in which a detector coil 31, that is wound in a solenoid shape, combined with a known high temperature superconducting bulk magnet 32 that generates magnetic fields in the vertical direction, was used for constructing the NMR imaging measurement for small animals. It is characterized by a solenoid coil that is wound so as to protrude significantly from the area of uniform magnetic field, which helps to recognize variations in magnetic flux in a wide range, but is poor in image measuring accuracy in comparison with the case in which the detector coil is disposed within the uniform magnetic field. With the bulk magnet, the highest magnetic field of the magnet was 10 T, but the highest magnetic field in the sample space was 4T. The uniformity in the magnetic field was 200 to 500 ppm or less due to nonuniformity of the high temperature superconducting body. The time-based stability of the magnetic field was in the order of 20 to 100 ppm/h due to the magnetic flux creeping phenomenon of the high temperature superconducting body. As a consequence, it represents a system that cannot reach the image resolution intended by the present invention at all.

In the study of the mechanism of how protein information is transmitted to facilitate life activity, such as the metabolism in a biosample, for example, cells, organic tissues, small animals, and the like, the nuclear magnetic resonance imaging that enables imaging of the interior of cells in a nondestructive manner can exhibit its greatest force. Accordingly, what kind of roles (functions) the individual protein has on the scale of a cell, organic tissues, or living organisms can be figured out, and thus, the study of life science can be significantly advanced.

Further, when the physico-chemical behavior of protein molecules can be brought out through the process of crystal growth, the physical behavior of protein molecules can be brought out in detail as well by analyzing the phase change process of crystallizing a solution to a solid substance. Therefore, the volume of a protein molecule at the moment when water is hydrated on a specific surface thereof can be estimated by examining the effects of pressure affected on the solubility of the protein in a state in which the crystal is growing.

When the function or crystal growth mechanism of a protein can be brought out, various protein molecules can be oriented on a substrate in any direction, and thus a biocomputer, molecular reactor, and molecular motor can be realized. When a given protein can be grown into a heteroepitaxial on the inorganic semiconductor substrate, it is considered that various applications, such as a light sensor, can be realized.

According to the present invention, analysis of the interaction between proteins becomes possible. In addition, imaging with a resolution not more than 1 micron becomes possible by supersensitive NMR measurement, which is three fold that possible theretofore. In accordance with the present invention, the required resonance frequency is at least 600 MHz; and, when the central magnetic field is operated at 900 MHz, which is the highest level in the current superconducting technology, a detection sensitivity corresponding to 2.7 GHz in the previously known apparatus may be obtained, which makes it possible to realize a supersensitive signal detection Which was heretofore impossible.

It is considered that competition of the analysis of a protein structure will be tightened in the future post-genome age, and thus, it is expected that the need for clarification of the functions and the interrelation of known proteins, that is, of interaction screening, will increase when we face the age of utilizing a structurally known protein. More specifically, it will find wide application in tailor-made new drugs, the biological industry, food products, the medical sector, and so on. In the near future, such as 5 to 10 years from now, under the circumstances in which the solid structure of a protein is increasingly clarified, it is expected that analysis of life phenomena positively utilizing its structural information and efforts in the field of control thereof will be significantly advanced. With the NMR imaging technology according to the present invention, the functions of a structurally known protein in living organisms and the control thereof, or applications of crystallization, can effectively be promoted in the study of the life sciences in this era.

Optimal development fully utilizing advanced biotechnology, while enjoying support of molecular design, combined with, for example, a calculated simulation, is necessary for creating industrial applications, such as molecular motors or biocomputers. With the present invention, the costs and term of development can be considerably reduced. The ripple effect of such advantages affected on this country and thus on all humankind is incalculable. Regarding the technological aspect, since the NMR technology of the present invention improves the detection sensitivity as much as three-fold or more than that possible heretofore, the accumulated time can be reduced to one-tenth, and thus, imaging in the cell becomes possible. Therefore, the affect of a micrometal on living bodies can effectively be investigated. More specifically, real-time follow up of the affects of a metal element of the same concentration as in the living bodies on the existence of a protein, or the dynamic state of a labeled protein or micronutrient in the living bodies by the use of the imaging method, may become applicable to a huge number of disorders involving micronutrient or protein in the living bodies, for example, development of medical treatment of Alzheimer's disease, or early diagnosis of chronic or intractable diseases before showing the symptoms of the diseases (diabetes or Creutzfeldt-Jakob disease).

Furthermore, according to the measurement technology of the present invention, the maintainability and installability of the measuring instrument can be significantly improved, and thus it provides good benefits when introduced. Especially, even with the relatively limited scale of experimental equipment, high-quality data acquisition, as available in the large-scale experimental equipment of the 900 MHz class, may be realized.

What is claimed is:

1. A supersensitive nuclear magnetic resonance (NMR) imaging apparatus comprising:
   a sample chamber positioned to receive a biosample for image analysis at a predetermined spatial resolution;
   a superconducting magnet formed of laterally split magnets, and a gradient magnetic field coil arranged to generate a gradient magnetic field in a horizontal direction for irradiation to the biosample in the sample chamber; and
   a solenoid type detection antenna arranged to detect a NMR signal obtained from the sample under irradiation of the gradient magnetic field for image analysis,
   wherein the biosample, including at least one of cells, organic tissues, and laboratory small animals, is inserted in the sample chamber of generally 1 to 30 mm in diameter at a center of the gradient magnetic field, from a direction orthogonal to the direction of the magnetic field, and position information is applied to the NMR signal by the gradient magnetic field.

2. A supersensitive nuclear magnetic resonance imaging apparatus according to claim 1, wherein a stationary magnetic field generated by the superconducting magnet is not less than 14.1 T, variations per hour in Proton nuclear magnetic resonance frequencies due to variations in the stationary magnetic field is not more than 1.0 Hz, and the uniformity of the stationary magnetic field in a sample space is not more than 1.0 Hz in Proton nuclear magnetic resonance frequencies.

3. A supersensitive nuclear magnetic resonance imaging apparatus according to claim 2, wherein the predetermined spatial resolution is not more than 1 micron.

4. A supersensitive nuclear magnetic resonance imaging apparatus according to claim 2, wherein protein information in organic tissues of the biosample can be imaged as two-dimensional or three-dimensional image information.

5. A supersensitive nuclear magnetic resonance imaging apparatus according to claim 1, wherein the predetermined spatial resolution is not more than 1 micron.

6. A supersensitive nuclear magnetic resonance imaging apparatus comprising:
   a sample chamber positioned to receive a biosample for image analysis at a predetermined spatial resolution;
   a superconducting magnet formed of laterally divided split magnets, and a gradient magnetic field coil arranged to generate a gradient magnetic field in a horizontal direction for irradiation to the biosample in the sample chamber; and
   a receiving coil arranged to detect a NMR signal obtained from the sample under irradiation of the gradient magnetic field for image analysis,
   wherein the biosample, including at least one of cells, organic tissues, and laboratory small animals, is inserted in the sample chamber of generally 1 to 30 mm in diameter at a center of the gradient magnetic field, from a direction orthogonal to the direction of the magnetic field; and
   wherein the receiving coil is formed of one of the oxide high temperature superconducting material, and magnesium diboride, and coil temperatures are between 5 K and 40 K inclusive.

7. A supersensitive nuclear magnetic resonance imaging apparatus comprising:
   a sample chamber positioned to receive a biosample for image analysis at a predetermined spatial resolution;
   a superconducting magnet formed of laterally divided split magnets, and a gradient magnetic field coil arranged to generate a gradient magnetic field in a horizontal direction for irradiation to the biosample in the sample chamber; and
   a receiving coil arranged to detect a NMR signal obtained from the sample under irradiation of the gradient magnetic field for image analysis, wherein the biosample, including at least one of cells, organic tissues, and laboratory small animals, is inserted in the sample chamber of generally 1 to 30 mm in diameter at a center of the gradient magnetic field from a direction orthogonal to the direction of the magnetic field;

wherein a stationery magnetic field generated by the superconducting magnet is not less than 14.1 T, variations per hour in Proton nuclear magnetic resonance frequencies due to variations in the stationary magnetic field is not more than 1.0 Hz, and the uniformity of the stationary magnetic field in a sample space is not more than 1.0 Hz in Proton nuclear magnetic resonance frequencies; and wherein the receiving coil is formed of one of the oxide high temperature superconducting material and magnesium diboride, and coil temperatures are between 5 K and 40 K inclusive.

8. A supersensitive nuclear magnetic resonance imaging apparatus comprising:

a sample chamber positioned to receive a biosample for image analysis at a predetermined spatial resolution;

a superconducting magnet formed of laterally divided split magnets and a gradient magnetic field coil arranged to generate a gradient magnetic field in a horizontal direction for irradiation to the biosample in the sample chamber; and a receiving coil arranged to detect a NMR signal obtained from the sample under irradiation of the gradient magnetic field for image analysis, wherein the biosample, including at least one of cells, organic tissues, and laboratory small animals, is inserted in the sample chamber of generally 1 to 30 mm in diameter at a center of the gradient magnetic field, from a direction orthogonal to the direction of the magnetic field;

wherein the predetermined spatial resolution for image analysis of the biosample is not more than 1 micron; and wherein the receiving coil is formed of one of oxide high temperature superconducting material, and magnesium diboride, and coil temperatures are between 5 K and 40 K inclusive.

9. A supersensitive nuclear magnetic resonance (NMR) imaging apparatus comprising:

a sample chamber positioned to receive a protein sample for image analysis at a predetermined spatial resolution;

a superconducting magnet formed of laterally divided split magnets, and a gradient magnetic field coil arranged to generate a gradient magnetic field in a horizontal direction for irradiation to the protein sample in the sample chamber, and a solenoid type detection antenna arranged to detect a NMR signal obtained from the protein sample under irradiation of the gradient magnetic field for image analysis;

wherein the protein sample dissolved into liquid is inserted into a sample tube, and placed in the sample chamber from a direction orthogonal to the direction of the gradient magnetic field, a protein crystal can be grown in the gradient magnetic field, the predetermined spatial resolution is obtained for observation of the surface property of the protein crystal when the protein dissolved in the liquid is crystallized, a growing velocity and a growing surface of the crystal can be observed on site by the nuclear magnetic resonance imaging, and crystal growth conditions can be controlled by obtained information.

10. A supersensitive nuclear magnetic resonance imaging apparatus according to claim 9, wherein a stationary magnetic field generated by the superconducting magnet is not less than 14.1 T, variations per hour in Proton nuclear magnetic resonance frequencies due to variations in the stationary magnetic field is not more than 1.0 Hz, and the uniformity of the stationary magnetic field in a sample space is not more than 1.0 Hz in Proton nuclear magnetic resonance frequencies.

11. A supersensitive nuclear magnetic resonance imaging apparatus according to claim 10, wherein the predetermined spatial resolution is not more than 1 micron.

12. A supersensitive nuclear magnetic resonance imaging apparatus according to claim 10, wherein protein information in organic tissues of the protein sample can be imaged as two-dimensional or three-dimensional image information.

13. A supersensitive nuclear magnetic resonance imaging apparatus according to claim 9, wherein the predetermined spatial resolution is not more than 1 micron.

14. A supersensitive nuclear magnetic resonance imaging apparatus according to claim 9, wherein protein information in organic tissues of the protein sample can be imaged as two-dimensional or three-dimensional image information.

15. A supersensitive nuclear magnetic resonance imaging apparatus comprising:

a sample chamber positioned to receive a protein sample for image analysis at a predetermined spatial resolution;

a superconducting magnet formed of laterally divided spilt magnets, and a gradient magnetic field coil arranged to generate a gradient magnetic field in a horizontal direction for irradiation to the protein sample in the sample chamber; and a receiving coil arranged to detect a NMR signal obtained from the protein sample under irradiation of the gradient magnetic field for image analysis, wherein the protein sample dissolved into liquid is inserted into a sample tube, and placed in the sample chamber from a direction orthogonal to the direction of the gradient magnetic field, a protein crystal can be grown in the gradient magnetic field;

wherein the predetermined spatial resolution is obtained for observation of the surface property of the protein crystal when the protein dissolved in the liquid is crystallized, a growing velocity and a growing surface of the crystal can be observed on site by the nuclear magnetic resonance imaging and crystal growth conditions can be controlled by obtained information; and wherein the receiving coil is formed of one of oxide high temperature superconducting material, and magnesium diboride, and coil temperatures are between 5 K and 40 K inclusive.

16. A supersensitive nuclear magnetic resonance imaging apparatus comprising:

a sample chamber positioned to receive a protein sample form image analysis at a predetermined spatial resolution;

a superconducting magnet formed of laterally divided split magnets, and a gradient magnetic field coil arranged to generate a gradient magnetic field in a horizontal direction for irradiation to the protein sample in the sample chamber; and a receiving coil arranged to detect a NMR signal obtained from the protein sample under irradiation of the gradient magnetic field for image analysis, wherein the protein sample dissolved into liquid is inserted into a sample tube, and placed in the sample chamber from a direction orthogonal to the direction of the gradient magnetic field, a protein crystal can be grown in the gradient magnetic field, the predetermined spatial resolution is obtained for observation of the surface property of the protein crystal when the protein dissolved in the liquid is crystallized, a growing velocity and a growing surface of the crystal can be observed on site by the nuclear magnetic resonance imaging, and crystal growth conditions can be controlled by obtained information;

wherein a stationary magnetic field generated by the superconducting magnet is not less than 14.1 T, variations per hour in Proton nuclear magnetic resonance frequencies due to variations in the stationary magnetic field is not more than 1.0 Hz, and the uniformity of the stationary magnetic field in a sample space is not more than 1.0 Hz in Proton nuclear magnetic resonance frequencies; and wherein the receiving coil is formed of one of oxide high temperature superconducting material and magnesium diboride, and coil temperatures are between 5 K and 40 K inclusive.

17. A supersensitive nuclear magnetic resonance imaging apparatus comprising:

a sample chamber positioned to receive a protein sample for image analysis at a predetermined spatial resolution;

a superconducting magnet formed of laterally divided spilt magnets, and a gradient magnetic field coil arranged to generate a gradient magnetic field in a horizontal direction for irradiation to the protein sample in the sample chamber; and a receiving coil arranged to detect a NMR signal obtained from the protein sample under irradiation of the gradient magnetic field for image analysis, wherein the protein sample dissolved into liquid is inserted into a sample tube, and placed in the sample chamber from a direction orthogonal to the direction of the gradient magnetic field, a protein crystal can be grown in the gradient magnetic field;

wherein the predetermined spatial resolution is not more than 1 micron, enabling observation of the surface property of the protein crystal when the protein dissolved in the liquid is crystallized a growing velocity and a growing surface of the crystal can be observed on site by the nuclear magnetic resonance imaging, and crystal growth conditions can be controlled by obtained information; and wherein the receiving call is formed of one of oxide high temperature superconducting material and magnesium diboride, and coil temperatures are between 5 K and 40 K inclusive.

* * * * *